United States Patent [19]

Madden

[11] Patent Number: 4,506,938
[45] Date of Patent: Mar. 26, 1985

[54] INTEGRATED CIRCUIT CHIP CARRIER MOUNTING ARRANGEMENT

[75] Inventor: James J. Madden, Naperville, Ill.

[73] Assignee: AT&T Bell Laboratories, Murray Hill, N.J.

[21] Appl. No.: 395,291

[22] Filed: Jul. 6, 1982

[51] Int. Cl.³ .............................................. H05K 1/12
[52] U.S. Cl. ............................ 339/17 CF; 324/158 F; 339/75 M; 339/176 M
[58] Field of Search .......... 339/17 CF, 75 M, 75 MP, 339/176 M, 176 MP, 59 M, 61 M; 324/73 PC, 158 F, 158 P

[56] References Cited

U.S. PATENT DOCUMENTS

| | | | |
|---|---|---|---|
| 3,795,884 | 3/1974 | Kotaka | 339/17 |
| 3,951,493 | 4/1976 | Kozel et al. | 339/61 M X |
| 3,960,423 | 6/1976 | Weisenburger | 339/17 CF |
| 4,050,755 | 9/1977 | Hasircoglu | 339/17 |
| 4,089,575 | 5/1978 | Grabbe | 339/17 |
| 4,109,378 | 8/1978 | Davies | 29/629 |
| 4,130,327 | 12/1978 | Spaulding | 339/17 |
| 4,144,648 | 3/1979 | Grovender | 339/75 |
| 4,334,727 | 6/1982 | Scheingold et al. | 339/17 CF |
| 4,341,433 | 7/1982 | Cherian et al. | 339/176 MP |
| 4,390,220 | 6/1983 | Benasutti | 339/17 CF |

Primary Examiner—Z. R. Bilinsky
Attorney, Agent, or Firm—William H. Kamstra; Ross T. Watland

[57] ABSTRACT

An arrangement for the solderless mounting of an integrated circuit chip carrier (13) on a printed wiring board (10). A socket (16), cemented to the board, is provided within which a leadless chip carrier (13) is fitted. Featured is a contact interface element (20) which presents an array of electrically conductive annular springs (27) which electrically connect the contact pads (14) of the chip carrier (13) and the contact pads (15) of the printed wiring board (10). The interface element (20) is clamped between the chip carrier (13) and the printed wiring board (10) by means of a compression spring (31) operating on the upper surface of the chip carrier (13).

12 Claims, 3 Drawing Figures

INTEGRATED CIRCUIT CHIP CARRIER MOUNTING ARRANGEMENT

TECHNICAL FIELD

This invention relates to electrical integrated circuit chips and more particularly to apparatus for electrically interconnecting such chips and the circuitry of a printed wiring board and the like.

BACKGROUND OF THE INVENTION

The fabrication of many electrical circuits and circuit elements integrally on a single silicon chip has long been known in the art. The chips themselves are retained on a ceramic substrate or carrier from which external electrical connections are made, in one known leadless type, from conductive contact pads arranged about its rectangular periphery. The chip carrier contact pads may be and have been affixed directly to printed wiring board circuitry by soldering, for example. This arrangement has a number of advantages including reduced circuit path lengths and, thereby, a reduction in lead inductance. The mounting is, however, more or less permanent; when a chip carrier is to be replaced, the solder joints must be melted and a new carrier must be resoldered in place. The relatively high temperatures required for the occasional chip carrier replacement tend to degrade thee life of both the chip and the printed wiring board. For this and other reasons to provide for the ready removal of a chip carrier, sockets have frequently been introduced into which the carrier may be removably fitted. Such an arrangement is shown, for example, in the patent of D. G. Grabbe, U.S. Pat. No. 4,089,575, issued May 16, 1978. A socket having internal contacts is provided which contacts are permanently soldered to the printed wiring board circuitry. A chip carrier having corresponding external contacts is then fitted into the socket, the contacts of both components making frictional engagement to achieve the electrical interconnections. In this arrangement as well as others, the external chip carrier contacts and the internal mating socket contacts add to the external measurements of the socket which in turn reduces the number of such sockets which may be mounted on a given printed wiring board. A further consideration as mentioned is the fact that the contacts of the socket are still permanently soldered to the circuitry of the wiring board with any attendant ill effects the high temperature may have on the board. It is accordingly an objective of the chip carrier mounting arrangement of the invention to achieve significant reduction in the area of a wiring board occupied by the carrier and the length of the connecting leads and to permit ready removal and replacement of the carrier.

SUMMARY OF THE INVENTION

The foregoing and other objectives are realized in one illustrative integrated circuit (IC) chip mounting arrangement according to the invention comprising a socket frame which is cemented or otherwise affixed to the surface of a printed wiring board about a rectangular pattern of electrically conductive contact pads. The pads are conventionally connected to the board printed circuitry and are arranged to correspond substantially to a rectangular arrangement of similar contact pads presented on the underside of an IC chip carrier which will ultimately be fitted within the socket frame. A novel feature of the invention is a contact interface element which is interposed between the chip carrier and the board contact pads, the interface element having a rectangular array of electrically conductive annular springs presented about its periphery, the array of springs corresponding to the patterns of contact pads of the wiring board and of the chip carrier. The interface element is first fitted within the socket frame so that lower arc portions of the springs make contact with respective corresponding contact pads of the printed wiring board. The chip carrier is then fitted within the socket frame so that upper arc portions of the springs make contact with respective corresponding contact pads on the underside of the chip carrier. A retaining spring fitted to and within the socket frame acts upon the upper surface of the chip carrier to clamp the contact interface between the carrier and the surface of the printed wiring board to ensure positive electrical connections and to maintain the components of the assembly in place.

BRIEF DESCRIPTION OF THE DRAWING

The organization of an integrated circuit chip carrier mounting arrangement according to the principles of the invention together with its features will be better understood from a consideration of the detailed description of one illustrative embodiment thereof which follows when taken on conjunction with the accompanying drawing in which.

DETAILED DESCRIPTION

Figure 1:
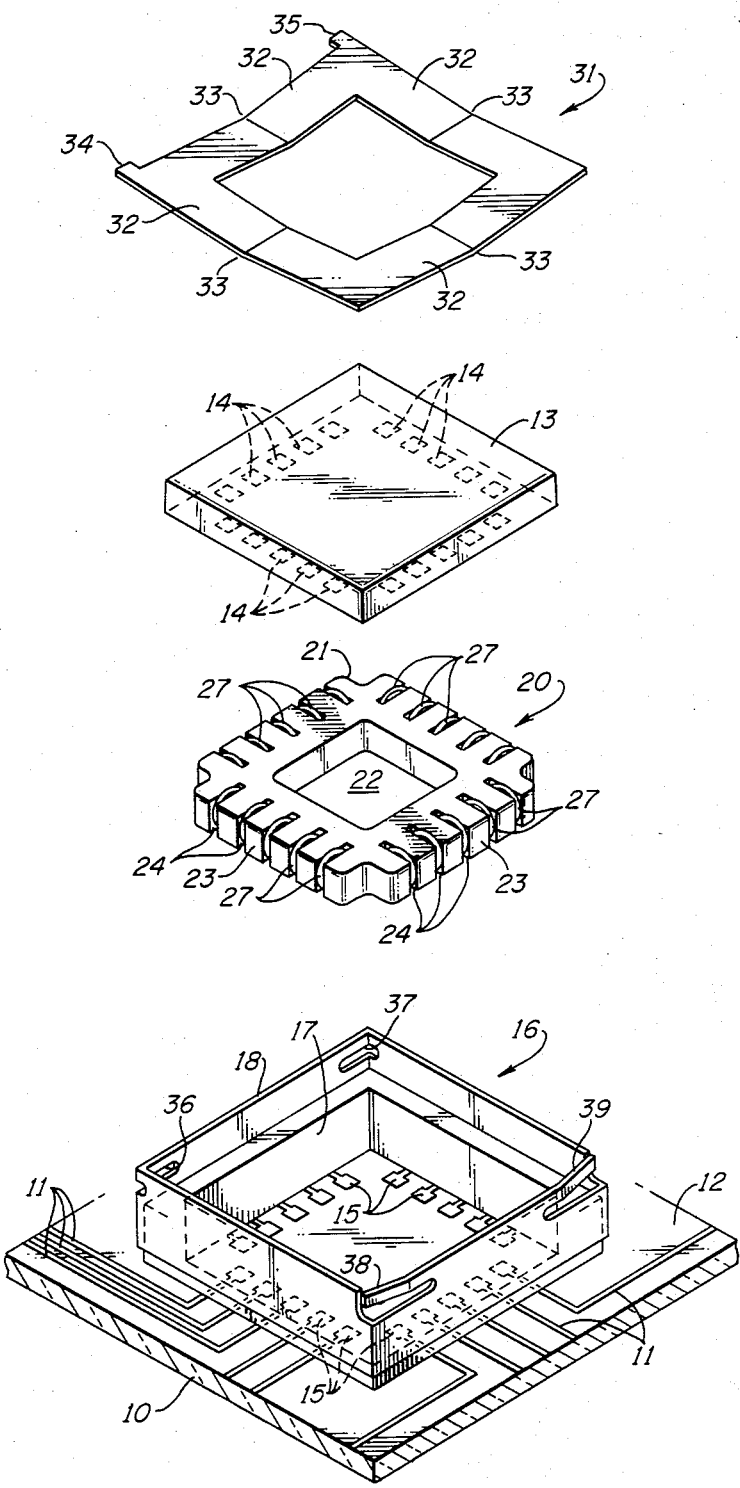
FIG. 1 is an exploded, perspective view of the components of an illustrative chip carrier mounting arrangement according to the invention.

Components of an illustrative integrated circuit chip carrier mounting arrangement according to the invention shown in exploded view in FIG. 1 include a typical printed wiring board 10 having printed wiring 11 affixed to a surface 12 thereof, of which wiring 11 the chip carrier 13 shown will ultimately be electrically connected. Chip carrier 13 is of the leadless type well known in the art and retains within it the integrated circuit silicon chips to be connected to the printed wiring board 10 circuitry. The connections are made from electrically conductive contact pads 14 arranged on the underside of chip carrier 13 about its rectangular perimeter. A corresponding rectangular array of electrically conductive contact pads 15 terminate particular circuits of printed wiring 11 of board 10. The components of the mounting arrangement (FIGS. 1 and 2) further includes a socket 16 comprising an inner insulative rectangular frame 17 and an outer metallic rectangular frame 18. Inner frame 17 is cemented or otherwise affixed to the surface 12 of board 10 and outer frame 18 is retained about frame 17 in any convenient manner such as by a turned-in lip 19 formed along the lower edges of frame 18. The inside dimensions of frame 17 are determined to freely admit chip carrier 13.

A novel feature of the mounting arrangement of the invention and another component shown in FIG. 1 is a contact interface element 20 comprising a rectangular insulative frame 21 having a central rectangular opening 22. Element 20 presents four perpendicular faces 23 each of which has a plurality of equally spaced slots 24 formed therein. Slots 24 are spaced to correspond to the spacings of contact pads 14 of chip carrier 13 and to the spacings of contact pads 15 of printed wiring board 10. As shown in the enlarged section view of FIG. 2, which is taken along the centers of opposite slots 24, each slot 24 has formed within the across it a wedge 25 having its apex directed toward the outer face of interface element 20. Each of the wedges 25 is oppositely notched at its base and at the base of a slot 24 to form a pair of opposite indents 26. The assemblage of interface element 20 is completed by the insertion in each of the slots 24 of an electrically conductive annular spring 27 of the character shown in FIG. 3. Although shown in circular cross section, spring 27 may be of any suitable form and is disjoined to present a small gap 28 therein. Springs 27 are dimensioned to fit snugly within slots 24 into which they are fitted during assembly by urging the open gap 28 unto wedges 25 thereby opening gap 28 until ends 29 and 30 of springs 27 are seated into indents 26. Springs 27 are then retained in place by spring action. The diameter of each of springs 27 is determined so that an arc portion thereof extends beyond the upper and lower surface of frame 21 and the dimensions of the latter are such that entire interface element 20 fits snugly within insulative frame 17. When so fitted, the lower arc portions of springs 27 (FIG. 2) rest on contact pads 15 of printed wiring 10. When chip carrier 13 is fitted within frame 17, its contact pads 14 rest on upper arc portions of springs 27 and frame 17 is dimensioned so that the upper surface of carrier 13 extends just beyond its upper edges.

Figure 2:
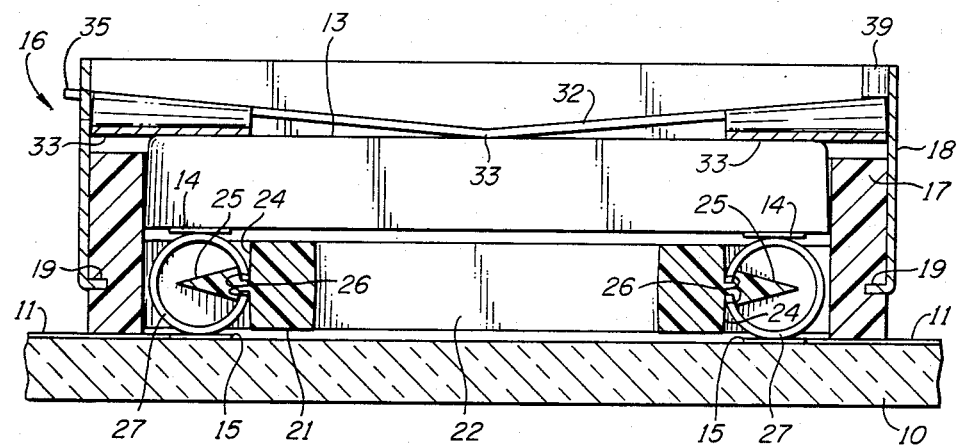
FIG. 2 is an enlarged sectional view of the assembled components of FIG. 1 showing particularly the details of the novel contact interface component feature of the invention.
Figure 3:
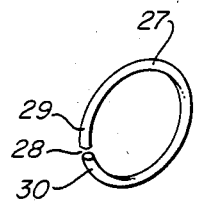
FIG. 3 shows an annular contact spring of the character employed in the interface feature of FIG. 2.

A final element of the mounting arrangement is a flat rectangular retaining spring 31 formed to present opposing legs 32 and dimensioned to fit freely within metallic frame 18 which frame extends beyond the upper edges of inner frame 17. Each of legs 32 is centrally crimped to present bearing edges 33 lying in a common plane. One of the legs 32 has a pair of tabs 34 and 35 extending from opposite ends thereof. After contact interface element 20 and chip carrier 13 have been fitted into socket 16 as previously described, retaining spring 31 is fitted within frame 18 of socket 16 so that the four bearing edges 33 rest on the upper surface of chip carrier 13 (FIG. 2). To ensure positive electrical connections between contact tabs 14 and 15, spring 31 is maintained under compression, at one side, by fitting tabs 34 and 35 into slots 36 and 37 provided at one side of frame 18. At the opposite side of frame 18 a pair of inwardly bent fingers 38 and 39 are formed which fingers are sprung outward to admit spring 31 and hold the latter in compression after assembly of the components.

What has been described is considered to be only one illustrative chip carrier mounting arrangement according to the principles of the invention. It is thus to be understood that various and numerous other arrangements may be devised by one skilled in the art without departing from the spirit and scope of the invention as defined only by the accompanying claims.

What is claimed is:

1. A mounting arrangement for mounting an integrated circuit chip carrier on a printed wiring board comprising a socket for receiving said chip carrier mounted on said board, a contact interface element fitted within said socket, and an array of electrically conductive annular springs individually retained by said element, said annular springs being oriented about a common axis within said springs, each said spring being substantially perpendicular to said axis, first arc portions of said springs making electrical contact with corresponding electrical contact pads on said printed wiring board, said springs being positioned so that second opposite arc portions of said springs can make electrical contact with corresponding contact pads of said chip carrier.

2. A mounting arrangement as claimed in claim 1 also comprising compression spring means for maintaining said chip carrier within said socket.

3. A mounting arrangement as claimed in claims 1 or 2 in which said socket and said interface element are rectangular in form and said array of annular springs is on one side of said rectangular interface element and wherein said mounting arrangement further comprises a second array of electrically conductive annular springs on the opposite side of said rectangular interface element.

4. An electrical interconnection assembly comprising a printed wiring board having a first array of electrical contact pads on a surface thereof, a contact interface element, an array of electrically conductive annular springs individually retained by said element and corresponding to said array of contact pads, said annular springs being oriented about a common axis within said springs, each said spring being substantially perpendicular to said axis, first arc portions of said springs being in electrical contact with respective contact pads of said array of contact pads, and an integrated circuit chip carrier having a second array of electrical contact pads corresponding to said first array of contact pads, said contact pads of said second array of contact pads being in electrical contact with respective second arc portions of said springs of said array of annular springs.

5. An electrical interconnection assembly as claimed in claim 4 also comprising a socket mounted on said printed wiring board for housing said contact interface element and said chip carrier.

6. An electrical interconnection assembly as claimed in claim 5 also comprising spring means for maintaining said chip carrier within said socket.

7. Apparatus for electrically interconnecting a first array of electrical contact pads of a printed wiring board and a second array of electrical contact pads of an integrated circuit chip carrier comprising a retaining frame and an array of electrically conductive annular springs individually retained on the periphery of said frame, said annular springs being oriented about a common axis within said springs, each said spring being substantially perpendicular to said axis, said springs being positioned so that first arc portions of said springs can make electrical contact with contact pads of said first array of contact pads and so that second arc portions of said springs can make electrical contact with contact pads of said second array of contact pads.

8. Apparatus as claimed in claim 7 in which said retaining frame is rectangular and in which said array of annular springs is on one side of said frame and wherein said apparatus further comprises a second array of electrically conductive annular springs on the opposite side of said frame.

9. Apparatus as claimed in claim 8 in which said retaining frame is formed to present vertical slots on its periphery said annular springs being fitted respectively in said slots.

10. Apparatus as claimed in claim 9 in which said retaining frame is formed to present outwardly directed wedges at the bases of said slots, the base of each of said wedges having opposite indents formed therein, and in which each of said annular springs is disjoined to form two ends, said two ends being dimensioned to be spread apart by a wedge and snapped into said indents when said springs are fitted into said slots.

11. An electrical interconnection assembly as claimed in claim 6 wherein said socket comprises an inner insulative rectangular frame and an outer metallic rectangular frame retained about said inner frame, said outer frame having a pair of slots on one side thereof and a pair of fingers on an opposite side thereof and wherein said spring means comprises a flat rectangular retaining spring formed to present opposing legs each being centrally crimped to present bearing edges lying in a common plane to apply pressure to said chip carrier, one of said legs having a pair of tabs extending from opposite ends thereof for insertion in said pair of slots and another one of said legs adapted to be held by said pair of fingers, whereby, after said contact interface element and said chip carrier have been fitted in said socket, said retaining spring is fitted within said outer frame so that said bearing edges rest on said chip carrier and said retaining spring is maintained under compression by fitting said pair of tabs of said retaining spring into said pair of slots on said one side of said outer frame and by springing outward said pair of fingers on said opposite side of said outer frame to admit and hold said retaining spring.

12. An electrical interconnection assembly as claimed in claim 4 wherein said second array of contact pads of said chip carrier is aligned substantially directly above said first array of contact pads of said wiring board.

* * * * *